United States Patent
Po et al.

(10) Patent No.: US 10,930,746 B2
(45) Date of Patent: Feb. 23, 2021

(54) DIFFERENTIAL TYPE SENSING CIRCUIT WITH DIFFERENTIAL INPUT AND OUTPUT TERMINAL PAIR

(71) Applicant: eMemory Technology Inc., Hsinchu (TW)

(72) Inventors: Chen-Hao Po, Hsinchu County (TW); Cheng-Te Yang, Hsinchu County (TW)

(73) Assignee: eMemory Technology Inc., Hsinchu (TW)

( * ) Notice: Subject to any disclaimer, the term of this patent is extended or adjusted under 35 U.S.C. 154(b) by 0 days.

(21) Appl. No.: 16/367,278

(22) Filed: Mar. 28, 2019

(65) Prior Publication Data
US 2019/0325924 A1 Oct. 24, 2019

Related U.S. Application Data

(60) Provisional application No. 62/659,150, filed on Apr. 18, 2018.

(51) Int. Cl.
*H01L 29/40* (2006.01)
*G11C 7/06* (2006.01)
(Continued)

(52) U.S. Cl.
CPC .......... *H01L 29/408* (2013.01); *G11C 5/147* (2013.01); *G11C 7/065* (2013.01); *G11C 7/08* (2013.01);
(Continued)

(58) Field of Classification Search
CPC .. G11C 7/065; G11C 7/08; G11C 7/12; G11C 7/14; G11C 17/16; G11C 17/18;
(Continued)

(56) References Cited

U.S. PATENT DOCUMENTS

| 5,253,210 A | 10/1993 | Terada |
| 7,046,575 B2 * | 5/2006 | Shin ...................... G11C 7/1069 |
| | | 365/191 |

(Continued)

FOREIGN PATENT DOCUMENTS

| CN | 1596447 | 3/2005 |
| CN | 106409338 | 2/2017 |
| CN | 106887246 | 6/2017 |

OTHER PUBLICATIONS

"Office Action of China Counterpart Application", dated Sep. 21, 2020, p. 1-p. 9.

*Primary Examiner* — Sultana Begum
(74) *Attorney, Agent, or Firm* — JCIPRNET

(57) ABSTRACT

A differential type non-volatile memory circuit comprising a differential sensing circuit, a differential data line pair, a memory cell array, and a differential bit line pair is provided. The differential sensing circuit has a differential input terminal pair and a differential output terminal pair. The differential data line pair is electrically connected to the differential input terminal pair of the differential sensing circuit. The memory cell array has at least one differential non-volatile memory cell configured to store data. The differential bit line pair is electrically connected between the memory cell array and the differential data line pair. When logic states of the differential output terminal pair start to be different in a read operation phase of the memory cell array, the differential sensing circuit and the differential data line pair are disconnected.

14 Claims, 5 Drawing Sheets

(51) Int. Cl.
| | |
|---|---|
| *G11C 7/12* | (2006.01) |
| *G11C 5/14* | (2006.01) |
| *G11C 17/16* | (2006.01) |
| *G11C 17/18* | (2006.01) |
| *H01L 21/28* | (2006.01) |
| *H01L 27/11517* | (2017.01) |
| *G11C 7/08* | (2006.01) |
| *H01L 21/02* | (2006.01) |
| *H01L 29/06* | (2006.01) |

(52) U.S. Cl.
CPC ............... *G11C 7/12* (2013.01); *G11C 17/16* (2013.01); *G11C 17/18* (2013.01); *H01L 21/022* (2013.01); *H01L 21/0217* (2013.01); *H01L 21/0226* (2013.01); *H01L 21/02107* (2013.01); *H01L 21/02109* (2013.01); *H01L 21/02112* (2013.01); *H01L 21/02225* (2013.01); *H01L 21/02247* (2013.01); *H01L 21/28202* (2013.01); *H01L 27/11517* (2013.01); *H01L 29/0603* (2013.01); *H01L 29/0607* (2013.01); *H01L 29/0638* (2013.01); *H01L 29/40114* (2019.08); *H01L 29/40117* (2019.08)

(58) Field of Classification Search
CPC ............... G11C 5/147; H01L 27/11517; H01L 27/11521; H01L 29/40114; H01L 29/40117
See application file for complete search history.

(56) References Cited

U.S. PATENT DOCUMENTS

| | | |
|---|---|---|
| 8,536,898 B2 | 9/2013 | Rennie et al. |
| 2006/0067147 A1 | 3/2006 | Roehr |
| 2006/0215438 A1* | 9/2006 | Suzuki ................ G11C 11/22 365/145 |
| 2008/0165592 A1 | 7/2008 | Kitagawa et al. |
| 2011/0298496 A1 | 12/2011 | Rennie et al. |
| 2014/0376300 A1 | 12/2014 | Hynes et al. |

* cited by examiner

DIFFERENTIAL TYPE SENSING CIRCUIT WITH DIFFERENTIAL INPUT AND OUTPUT TERMINAL PAIR

CROSS-REFERENCE TO RELATED APPLICATION

This application claims the priority benefit of U.S. provisional application Ser. No. 62/659,150, filed on Apr. 18, 2018. The entirety of the above-mentioned patent application is hereby incorporated by reference herein and made a part of this specification.

BACKGROUND

Technical Field

The invention relates to a non-volatile memory circuit. More particularly, the invention relates to a low power differential type non-volatile memory circuit.

Description of Related Art

Generally, a differential bit line pair and a differential data line pair in the differential type non-volatile memory circuit are typically pre-charged from a ground potential to a predetermined potential before a read operation is performed on a memory cell of the differential type non-volatile memory circuit. Therefore, a current of the memory cell in the differential non-volatile memory circuit could discharge a bit line of the differential bit line pair and a data line of the differential data line pair to the ground potential during the read operation. Thereby specific differential input voltages at a differential input terminal pair of a sense amplifier could be established, and the differential input voltages could be compared by the sense amplifier to determine the data stored in the memory cell is at logic state "0" or "1".

However, discharging the bit line and the data line from the predetermined potential to the ground potential, and pre-charging again the bit line and the data line from the ground potential to the predetermined potential before the next read operation, which will increase the power consumption of the read operation of the differential type non-volatile memory circuit.

SUMMARY

The invention provides a differential type non-volatile memory circuit that can effectively reduce the power consumption of data reading operations.

The differential type non-volatile memory circuit of the invention comprises a differential sensing circuit, a differential data line pair, a memory cell array, and a differential bit line pair. The differential sensing circuit has a differential input terminal pair and a differential output terminal pair. The differential data line pair is electrically connected to the differential input terminal pair of the differential sensing circuit. The memory cell array has at least one differential non-volatile memory cell configured to store data. The differential bit line pair is electrically connected between the memory cell array and the differential data line pair. When logic states of the differential output terminal pair start to be different in a read operation phase of the memory cell array, the differential sensing circuit and the differential data line pair are disconnected.

Base on the above, the differential type non-volatile memory circuit of the invention would disconnects the differential sensing circuit from the differential data line pair when the logic states of the differential output terminal pair of the differential sensing circuit starts to be different. In this way, electric charge on the differential data line pair and the differential bit line pair could be prevented from being dumped. In addition, since the differential sensing circuit and the differential data line pair are disconnected, the input loading of the differential sensing circuit could be reduced, thereby reducing the operation current of the differential sensing circuit to achieve power saving.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Herein, several embodiments of the invention are introduced to describe the invention; however the invention is not limited by the embodiments. Suitable combinations among the embodiments are also allowed. The term "coupled to" used throughout the embodiments (including claims) may refer to any direct and indirect connection means. For example, if a first device is described as being coupled to a second device in the embodiments, the sentence should be explained as the first device may be connected to the second device directly, or the first device may, through any other device or through certain connection means, be connected to the second device indirectly. In addition, the word "signal" may refer to at least one current, voltage, electric charge, temperature, data, electromagnetic wave, or any other signal or signals.

Figure 1:
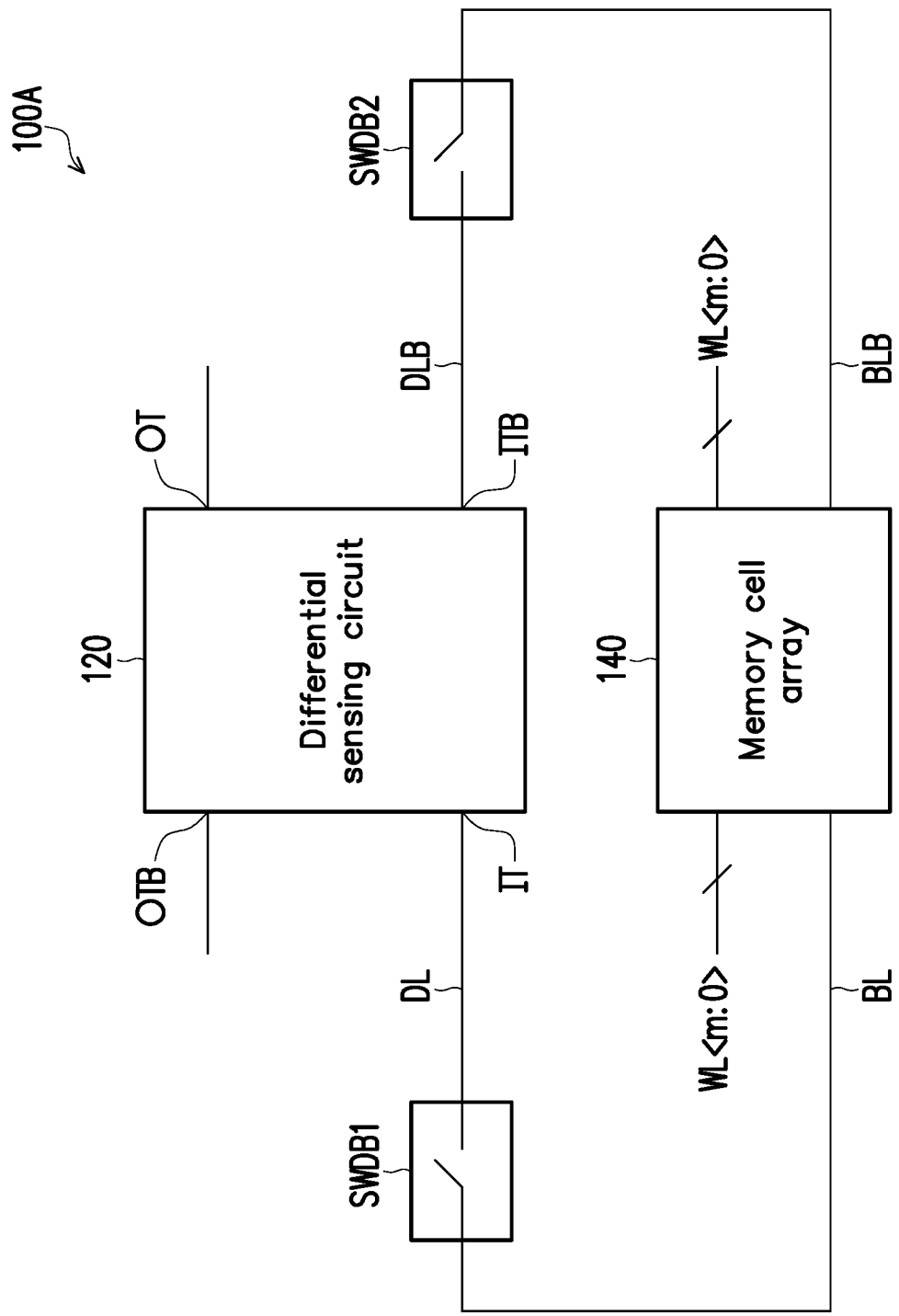
FIG. 1 is a schematic diagram illustrating a differential type non-volatile memory circuit according to an embodiment of the invention.

FIG. 1 is a schematic diagram illustrating a differential type non-volatile memory circuit according to an embodiment of the invention. Referring to FIG. 1, the differential type non-volatile memory circuit 100A includes a differential sensing circuit 120, a memory cell array 140, at least one word line WL<m: 0>, a differential data line pair, and a differential bit line pair.

The differential data line pair includes a data line DL and a complementary data line DLB, and the differential bit line pair includes a bit line BL and a complementary bit line BLB. The differential sensing circuit 120 has a differential input terminal pair and a differential output terminal pair. The differential input terminal pair includes a first input terminal IT and a complementary second input terminal ITB, and the differential output terminal pair includes a first output terminal OT and a complementary second output terminal OTB. The memory cell array 140 has at least one differential non-volatile memory cell configured to store data. Each of the at least one differential non-volatile memory cell is coupled to corresponding one of the at least one word line WL<m: 0> and a differential bit line pair (i.e., the bit line BL and the complementary bit line BLB).

The differential data line pair is electrically connected to the differential input terminal pair of the differential sensing circuit 120. In detail, the data line DL is electrically connected to the first input terminal IT of the differential sensing circuit 120, and the complementary data line DLB is electrically connected to the second input terminal ITB of the differential sensing circuit 120. The differential bit line pair is electrically connected between the memory cell array 140 and the differential data line pair. In detail, the bit line BL is electrically connected between the memory cell array 140 and the data line DL, and the complementary bit line BLB is electrically connected between the memory cell array 140 and the complementary data line DLB.

In an embodiment of the invention, the memory cell array 140 could be implemented by an existing differential type non-volatile memory cell array.

In an embodiment of the invention, a channel gate switch SWDB1 may be disposed between the bit line BL and the data line DL, and a channel gate switch SWDB2 may be disposed between the complementary bit line BLB and the complementary data line DLB. By turning on the channel gate switches SWDB1 and SWDB2, an electrical path between the bit line BL and the data line DL can be established, and an electrical path between the complementary bit line BLB and the complementary data line DLB can be established.

In an embodiment of the invention, the channel gate switches SWDB1 and SWDB2 can be implemented by using a transmission gate, but the invention is not limited thereto.

In an embodiment of the invention, the differential sensing circuit 120 may have a pre-charging circuit, wherein the pre-charging circuit is coupled to the data line DL and the complementary data line DLB, and configured to pre-charge the bit line BL, the data line DL, the complementary bit line BLB, and the complementary data line DLB, but the invention is not limited thereto. In another embodiment of the invention, the pre-charging circuit may also be a separate circuit disposed outside of the differential sensing circuit 120.

Generally, the bit line BL, the data line DL, the complementary bit line BLB, and the complementary data line DLB would be pre-charged before the data of the memory cell array 140 could be read out. Next, in a read operation phase of the memory cell array 140, the electric charge on one of the bit line BL (data line DL) and the complementary bit line BLB (complementary data line DLB) would be discharged based on a cell current which is related to the data (e.g., logic 1 or logic 0) stored in the selected differential non-volatile memory cell, such that a voltage difference is established between the bit line BL (data line DL) and the complementary bit line BLB (complementary data line DLB). The differential sensing circuit 120 could provide different logic states at the first output terminal OT and the second output terminal OTB according to the voltage difference between the data line DL and the complementary data line DLB to represent the data stored in the selected differential non-volatile memory cell.

For example, the differential sensing circuit 120 may provide a logic low state at the first output terminal OT and a logic high state at the second output terminal OTB to represent the data stored in the selected differential non-volatile memory cell is logic 0. Similarly, the differential sensing circuit 120 may provide a logic high state at the first output terminal OT and a logic low state at the second output terminal OTB to represent the data stored in the selected differential non-volatile memory cell is logic 1. However, the invention is not limited thereto.

When the logic state of the first output terminal OT and the logic state of the second output terminal OTB starts to be different in the read operation phase of the memory cell array 140, it is indicated that the differential sensing circuit 120 has sensed the data stored in the differential non-volatile memory cell. In this case, the differential sensing circuit 120 and the differential data line pair (i.e., the data line DL and the complementary data line DLB) could be disconnected, such that the electric charge on the data line DL (the bit line BL) and the complementary data line DLB (the complementary bit line BLB) is prevented from being dumped by the differential sensing circuit 120 for power saving. In addition, since the differential sensing circuit 120 and the differential data line pair are disconnected, the input loading of the differential sensing circuit 120 could be reduced, thereby reducing the operation current of the differential sensing circuit to achieve power saving.

Figure 2:
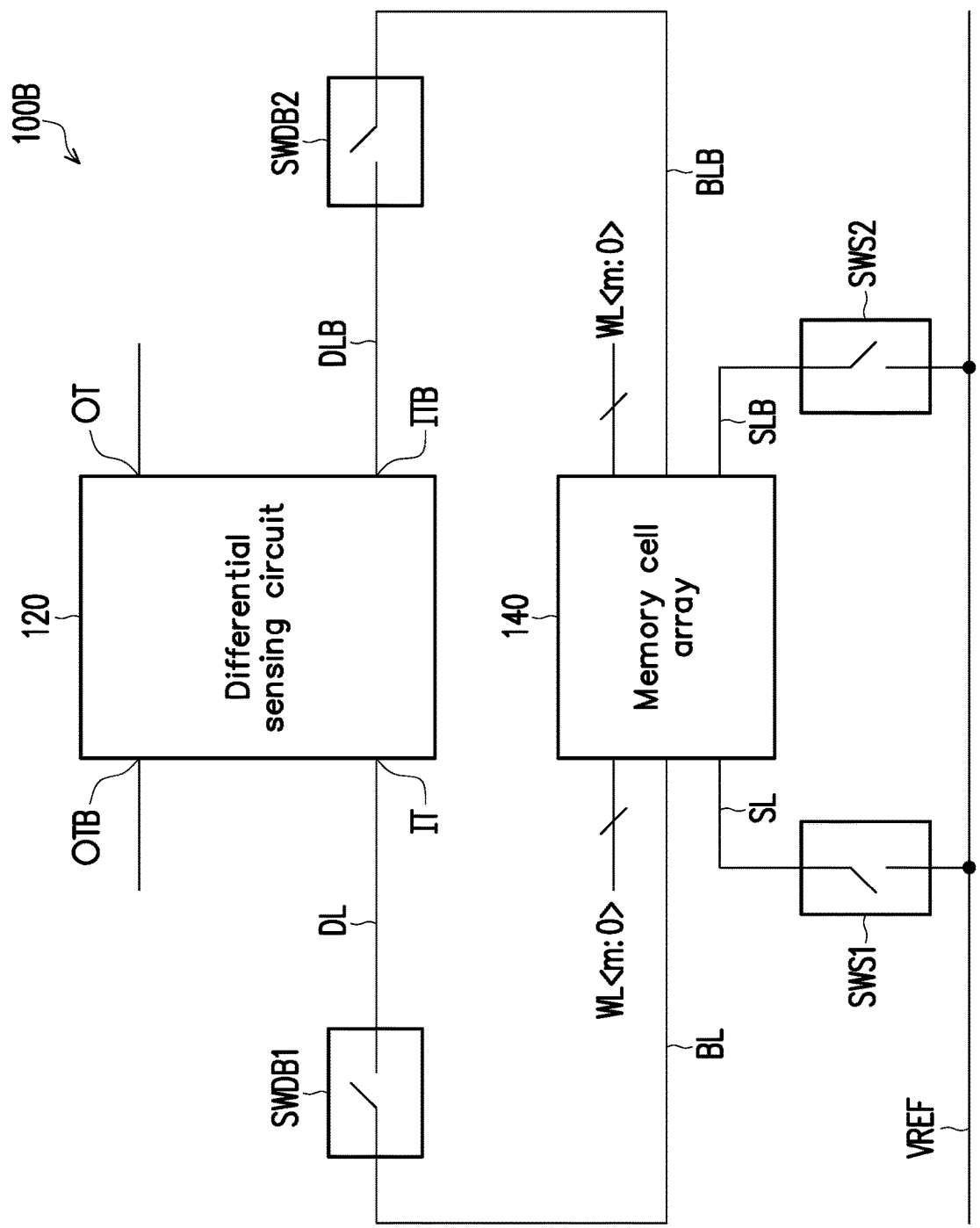
FIG. 2 is a schematic diagram illustrating a differential type non-volatile memory circuit according to another embodiment of the invention.

FIG. 2 is a schematic diagram illustrating a differential type non-volatile memory circuit according to another embodiment of the invention. Referring to FIG. 1 and FIG. 2 together. The architecture of the differential type non-volatile memory circuit 100B in FIG. 2 is similar to that of the differential type non-volatile memory circuit 100A in FIG. 1, and the only difference is that the differential type non-volatile memory circuit 100B further comprises a first source line switch SWS1, a second source line switch SWS2, and a differential source line pair. The differential source line pair includes a first source line SL and a complementary second source line SLB. A first end of the first source line switch SWS1 is electrically connected to a reference voltage VREF. A first end of the second source line switch SWS2 is electrically connected to the reference voltage VREF. The first source line SL is electrically connected between the memory cell array 140 and a second end of the first source line switch SWS1. The second source line SLB is electrically connected between the memory cell array 140 and a second end of the second source line switch SWS2. In an embodiment of the invention, the reference voltage VREF may be, for example, a ground voltage, but the invention is not limited thereto.

The operation of the differential type non-volatile memory circuit 100B in FIG. 2 is similar to the operation of the differential type non-volatile memory circuit 100A in FIG. 1; therefore, reference can be made to the above related description of FIG. 1. In addition, in the read operation phase of the memory cell array 140, when the logic state of the first output terminal OT and the logic state of the second output terminal OTB starts to be different, it is indicated that the differential sensing circuit 120 has sensed the data stored in the differential non-volatile memory cell. In this case, the first source lines switch SWS1 and the second source line switch SWS2 could be turned off.

The differential data line pair (i.e., the data line DL and the complementary data line DLB), the differential bit line pair (i.e., the bit line BL and the complementary bit line BLB), and the differential source line pair (i.e., the first source line SL and the second source line SLB) are floating after the differential sensing circuit 120 and the differential data line pair are disconnected and the first source line switch SWS1 and the second source line switch SWS2 are turned off. In this way, the electric charge on the data line DL (the bit line BL) can be prevented from being dumped to the reference voltage VREF through the memory cell array 140 and the first source line SL. Or, the electric charge on the complementary data line DLB (the complementary bit line BLB) is prevented from being dumped to the reference voltage VREF through the memory cell array 140 and the second source line SLB, so that the power saving effect can be achieved. Therefore, the effect of power saving can be achieved.

It could be understood that after the differential sensing circuit 120 and the differential data line pair are disconnected and the first source line switch SWS1 and the second source line switch SWS2 are turned off, the electric charge of the data line DL and the bit line BL may be retained on the data line DL and the bit line BL, and the electric charge of the complementary data line DLB and the complementary bit line BLB may be retained on the complementary data line DLB and the complementary bit line BLB. In this way, the amount of electric charge that required to be pre-charged for a pre-charge operation next time could be reduced to achieve the effect of power saving.

Figure 3:
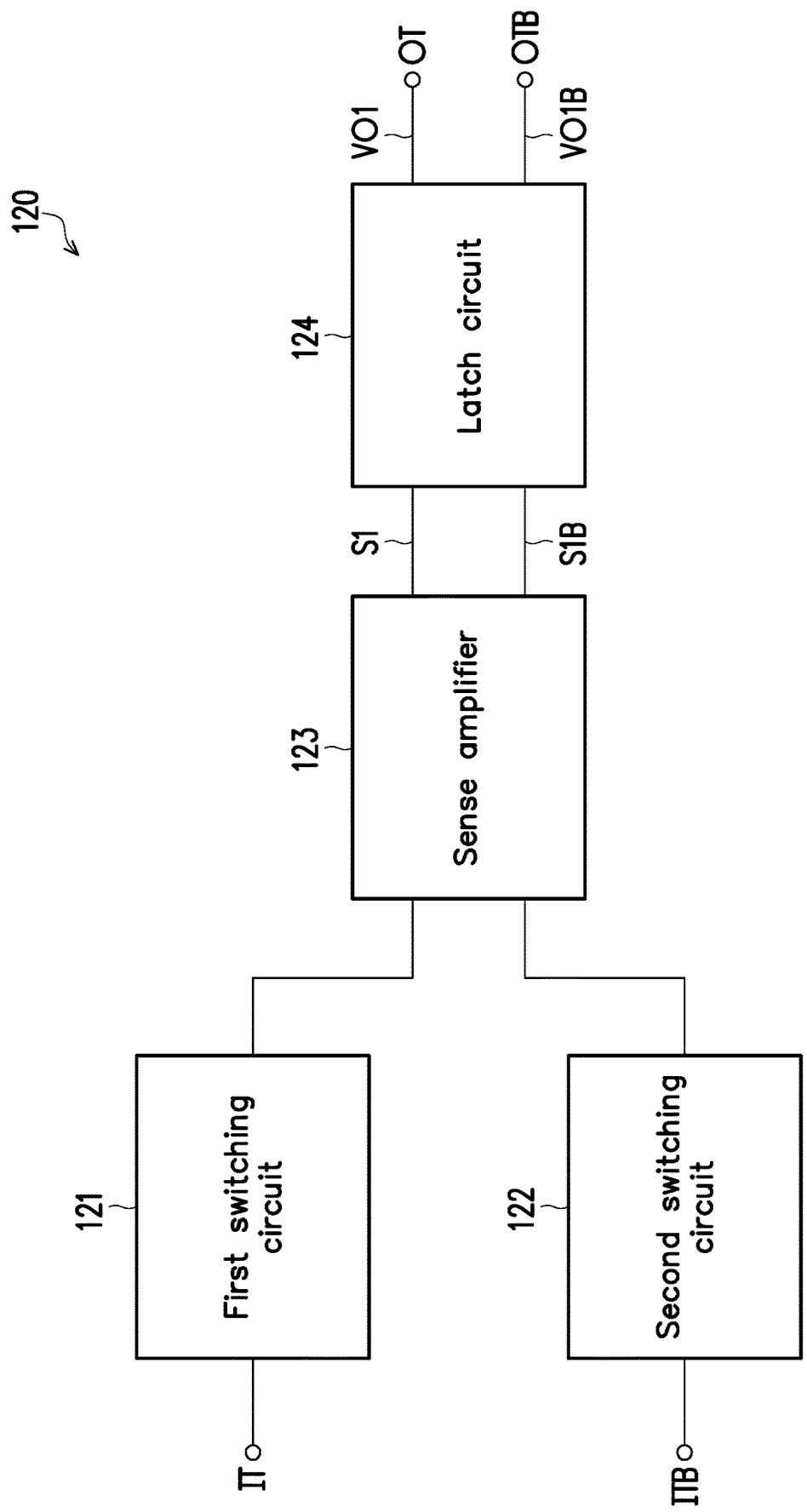
FIG. 3 is a schematic diagram illustrating a differential sensing circuit according to an embodiment of the invention.

FIG. 3 is a schematic diagram illustrating a differential sensing circuit according to an embodiment of the invention. Referring to FIG. 2 and FIG. 3 together. The differential sensing circuit 120 includes a first switching circuit 121, a second switching circuit 122, a sense amplifier 123, and a latch circuit 124, but is not limited thereto. A first end of the first switching circuit 121 is coupled to the first input terminal IT. A first end of the second switching circuit 122 is coupled to the second input terminal ITB. The sense amplifier 123 is coupled to a second end of the first switching circuit 121 and a second end of the second switching circuit 122. The sense amplifier 123 is configured to amplify a voltage difference between the data line DL and the complementary data line DLB to generate a first differential signal pair when the first switching circuit 121 and the second switching circuit 122 are turned on, wherein the first differential signal pair includes a signal Si and a complementary signal S1B. The latch circuit 124 is coupled to the sense amplifier 123 to receive and latch the signal Si and the complementary signal SIB, and respectively provide a first output voltage VO1 and a second output voltage VO1B to the first output terminal OT and the second output terminal OTB.

In an embodiment of the invention, the first switching circuit 121 and the second switching circuit 122 may be implemented by a multiplexer, but are not limited thereto. In an embodiment of the invention, the sense amplifier 123 could be implemented by an existing sense amplifier, but are not limited thereto. In an embodiment of the invention, the latch circuit 124 could be implemented by a SR latch, but are not limited thereto.

The operation details of the differential type non-volatile memory circuit 100B in FIG. 2 will be described below in conjunction with the differential sensing circuit 120 in FIG. 3. Referring to FIG. 2 and FIG. 3 together. First, in a standby phase after the memory cell array 140 has been powered, the differential sensing circuit 120 and the differential data line pair are disconnected (i.e., the first switching circuit 121 and the second switching circuit 122 are in an off state), and the first source line switch SWS1 and the second source line switch SWS2 are in an on state. At this time, the latch circuit 124 of the differential sensing circuit 120 provides the first output voltage VO1 and the second output voltage VO1B with the same logic state to the first output terminal OT and the second output terminal OTB, and the voltage of the differential data line pair, the voltage of the differential bit line pair, and the voltage of the differential source line pair are at the reference voltage VREF.

Figure 4:
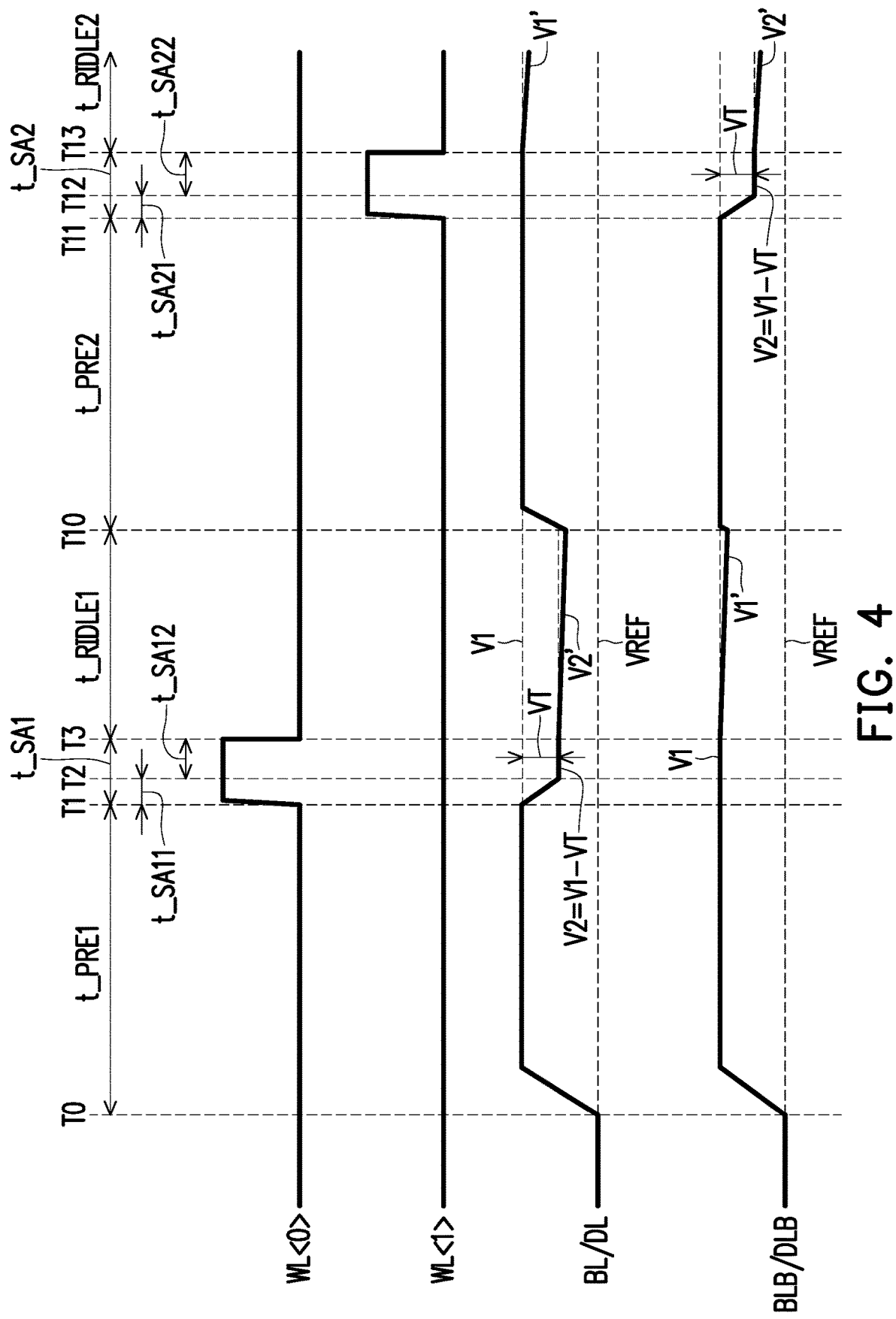
FIG. 4 is a timing diagram of signals for the data read operation performed by the differential type non-volatile memory circuit according to an embodiment of the invention.

The details of the data read operation of the differential type non-volatile memory circuit 100B will be described below. Referring to FIG. 2 to FIG. 4 together. FIG. 4 is a timing diagram of signals for the data read operation performed by the differential type non-volatile memory circuit according to an embodiment of the invention. In the following, it assumes that the data stored in the selected differential non-volatile memory cell corresponding to the word line WL<0> is logic 1, and the data stored in the selected differential non-volatile memory cell corresponding to the word line WL<1> is logic 0. First, in the pre-charging phase t_PRE1 between the time point T0 and the time point T1, the channel gate switches SWDB1 and SWDB2 are in an on state, the first source line switch SWS1 and the second source line switch SWS2 are in an on state, the differential sensing circuit 120 and the data line DL are electrically connected (i.e., the first switching circuit 121 is in an on state), and the differential sensing circuit 120 and the complementary data line DLB are electrically connected (i.e., the second switching circuit 122 is in an on state). Therefore, the pre-charging circuit (not shown) in the differential type non-volatile memory circuit 100B would charge the bit line BL, the data line DL, the complementary bit line BLB, and the complementary data line DLB from the reference voltage VREF to the first voltage V1. In the pre-charging phase t_PRE1, since the voltage difference between the data line DL and the complementary data line DLB is smaller than the sensing threshold voltage VT of the sense amplifier 123 in the differential sensing circuit 120, the latch circuit 124 of the differential sensing circuit 120 is in a metastable state and outputs the first output voltage VO1 and the second output voltage VO1B which are at the same logic state to the first output terminal OT and the second output terminal OTB.

Next, in the read operation phase t_SA1 between the time point T1 and the time point T3, the word line WL<0> is enabled, and thus the differential non-volatile memory cell corresponding to the word line WL<0> is selected. Based on the data stored in the selected differential non-volatile memory cell, which is logic 1, the cell current of the selected differential non-volatile memory cell starts to discharge the bit line BL and the data line DL at the time point T1, and the voltage value of the complementary bit line BLB and the complementary data line DLB are kept at the first voltage V1. Therefore, there is a voltage difference between the bit line BL (the data line DL) and the complementary bit line BLB (the complementary data line DLB). In the first sub-phase t_SA11 from the time point T1 to the time point T2, the voltage difference between the data line DL and the complementary data line DLB is smaller than the sensing threshold voltage VT of the sense amplifier 123 in the differential sensing circuit 120, and thus the logic state of the first output terminal OT and the logic state of the second output terminal OTB remain the same. In addition, the first source line switch SWS1 and the second source line switch SWS2 remain in the on state, the differential sensing circuit 120 and the data line DL remains electrically connected (i.e., the first switching circuit 121 is in the on state), and the differential sensing circuit 120 and the complementary data line DLB remains electrically connected (i.e., the second switching circuit 122 is in the on state).

At the time point T2, the voltage difference between the data line DL and the complementary data line DLB is equal to the sensing threshold voltage VT of the sense amplifier 123 in the differential sensing circuit 120, so the latch circuit 124 of the differential sensing circuit 120 enters into a latch state, such that the logic state of the first output terminal OT and the logic state of the second output terminal OTB starts to be different. For example, the first output terminal OT is at a logic high state, and the second output terminal OTB is at a logic low state, but the invention is not limited thereto. In the read operation phase t_SA1 of the memory cell array 140, when the logic state of the first output terminal OT and the logic state of the second output terminal OTB starts to be different, it is indicated that the differential sensing circuit 120 has sensed the data stored in the differential non-volatile memory cell. Therefore, in the second sub-phase t_SA12 from the time point T2 to the time point T3, the differential sensing circuit 120 and the differential data line pair (i.e., the data line DL and the complementary data line DLB) could be disconnected (i.e., the first switching circuit 121 and the second switching circuit 122 are turned off), and the first source line switch SWS1 and the second source line switch SWS2 could be turned off, so as to prevent the electric charge on the data line DL (the bit line BL) and the complementary data line DLB (the complementary bit line BLB) from being dumped. In the second sub-phase t_SA12, the voltage at the data line DL (the bit line BL) is a second voltage V2, wherein the second voltage V2 is equal to the first voltage V1 minus the sensing threshold voltage VT of the sense amplifier 123 in the differential sensing circuit 120 (i.e., V2=V1−VT). In addition, since the first switching circuit 121 and the second switching circuit 122 are turned off, the input loading of the differential sensing circuit 120 can be reduced, and thus the operating current of the differential sensing circuit 120 can also be reduced, thereby power saving is achieved. Next, in the idle phase t_RIDLE1 from the time point T3 to the time point T10, the first switching circuit 121 and the second switching circuit 122 are in the off state, the logic state of the first output terminal OT and the logic state of the second output terminal OTB remain different, the first source line switch SWS1 and the second source line switch SWS2 are in the off state, and the differential data line pair (i.e., the data line DL and the complementary data line DLB), the differential bit line pair (i.e., the bit line BL and the complementary bit line BLB) and the differential source line pair (i.e., the first source line SL and the second source line SLB) are floating. In the idle phase t_RIDLE1, due to a tiny current leakage on the data line DL and the bit line BL, the voltage V2' on the data line DL and the bit line BL would be between the second voltage V2 and the reference voltage VREF. Similarly, based on a tiny current leakage on the complementary data line DLB and the complementary bit line BLB, the voltage V1' on the complementary data line DLB and the complementary bit line BLB would be between the first voltage V1 and the reference voltage VREF.

Next, in the pre-charging phase t_PRE2 from time point T10 to the time point T11, the channel gate switches SWDB1 and SWDB2 are in the on state, the first source line switch SWS1 and the second source line switch SWS2 are in the on state, the differential sensing circuit 120 and the data line DL are electrically connected (i.e., the first switching circuit 121 is in the on state), and the differential sensing circuit 120 and the complementary data line DLB are electrically connected (i.e., the second switching circuit 122 is in the on state). Therefore, the pre-charging circuit (not shown) in the differential type non-volatile memory circuit 100B would charge the bit line BL and the data line DL from the voltage V2' to the first voltage V1, and charge the complementary bit line BLB and the complementary data line DLB from the voltage V1' to the first voltage V1. In the pre-charging phase t_PRE2, since the voltage difference between the data line DL and the complementary data line DLB is smaller than the sensing threshold voltage VT of the sense amplifier 123 in the differential sensing circuit 120, the latch circuit 124 of the differential sensing circuit 120 is in the metastable state and outputs the first output voltage VO1 and the second output voltage VO1B which are at the same logic state to the first output terminal OT and the second output terminal OTB.

Next, in the read operation phase t_SA2 from the time point T11 to the time point T13, the word line WL<1> is enabled, and thus the differential non-volatile memory cell corresponding to the word line WL<1> is selected. Based on the data stored in the selected differential non-volatile memory cell, which is logic 0, the cell current of the selected differential non-volatile memory cell starts to discharge the complementary bit line BLB and the complementary data line DLB at the time point T11, and the voltage on the bit line BL and the data line DL are kept at the first voltage V1. Therefore, there is a voltage difference between the bit line BL (the data line DL) and the complementary bit line BLB (the complementary data line DLB). In the first sub-phase t_SA21 from the time point T11 to the time point T12, the voltage difference between the data line DL and the complementary data line DLB is smaller than the sensing threshold voltage VT of the sense amplifier 123 in the differential sensing circuit 120, and thus the logic state of the first output terminal OT and the logic state of the second output terminal OTB remain the same. In addition, the first source line switch SWS1 and the second source line switch SWS2 remain in the on state, the differential sensing circuit 120 and the data line DL remains electrically connected (i.e., the first switching circuit 121 is in the on state), and the differential sensing circuit 120 and the complementary data line DLB remains electrically connected (i.e., the second switching circuit 122 is in the on state).

At the time point T12, the voltage difference between the data line DL and the complementary data line DLB is equal to the sensing threshold voltage VT of the sense amplifier 123 in the differential sensing circuit 120, so the latch circuit 124 of the differential sensing circuit 120 enters into the latch state, such that the logic state of the first output terminal OT and the logic state of the second output terminal OTB starts to be different. For example, the first output terminal OT is at a logic low state, and the second output terminal OTB is at a logic high state, but the invention is not limited thereto. In the read operation phase t_SA2 of the memory cell array 140, when the logic state of the first output terminal OT and the logic state of the second output terminal OTB start to be different, it is indicated that the differential sensing circuit 120 has sensed the data stored in the differential non-volatile memory cell. Therefore, in the second sub-phase t_SA22 from the time point T12 to the time point T13, the differential sensing circuit 120 and the differential data line pair (i.e., the data line DL and the complementary data line DLB) could be disconnected (i.e., the first switching circuit 121 and the second switching circuit 122 are turned off), and the first source line switch SWS1 and the second source line switch SWS2 could be turned off, so as to prevent the electric charge on the data line DL (the bit line BL) and the complementary data line DLB (the complementary bit line BLB) from being dumped. In the second sub-phase t_SA22, the voltage on the complementary data line DLB (the complementary bit line BLB) is at the second voltage V2, wherein the second voltage V2 is equal to the first voltage V1 minus the sensing threshold voltage VT of the sense amplifier 123 in the differential sensing circuit 120 (i.e., V2=V1−VT). In addition, since the first switching circuit 121 and the second switching circuit 122 are turned off, the input loading of the differential sensing circuit 120 can be reduced, thus the operating current of the differential sensing circuit 120 can also be reduced, so as to achieve power saving.

Next, in the idle phase t_RIDLE2 after the time point T13, the first switching circuit 121 and the second switching circuit 122 are in the off state, the logic state of the first output terminal OT and the logic state of the second output terminal OTB remain different, the first source line switch SWS1 and the second source line switch SWS2 are in the off state, and the differential data line pair (i.e., the data line DL and the complementary data line DLB), the differential bit line pair (i.e., the bit line BL and the complementary bit line BLB) and the differential source line pair (i.e., the first source line SL and the second source line SLB) are floating. In the idle phase t_RIDLE2, due to a tiny current leakage on the data line DL and the bit line BL, the voltage V1' of the data line DL and the bit line BL would be between the first voltage V1 and the reference voltage VREF. Similarly, due to a tiny current leakage on the complementary data line DLB and the complementary bit line BLB, the voltage V2' of the complementary data line DLB and the complementary bit line BLB would be between the second voltage V2 and the reference voltage VREF.

According to the above description, if the differential type non-volatile memory circuit 100B continuously performs data read operation, the voltages of the differential data line pair (i.e., the data line DL and the complementary data line DLB) and the differential bit line pair (i.e., the bit line BL and the complementary bit line BLB) in the differential type non-volatile memory circuit 100B swing between the first voltage V1 and the voltage V2', which effectively reduce the amount of the electric charge charged and discharged in the data read operation for power saving.

Figure 5:
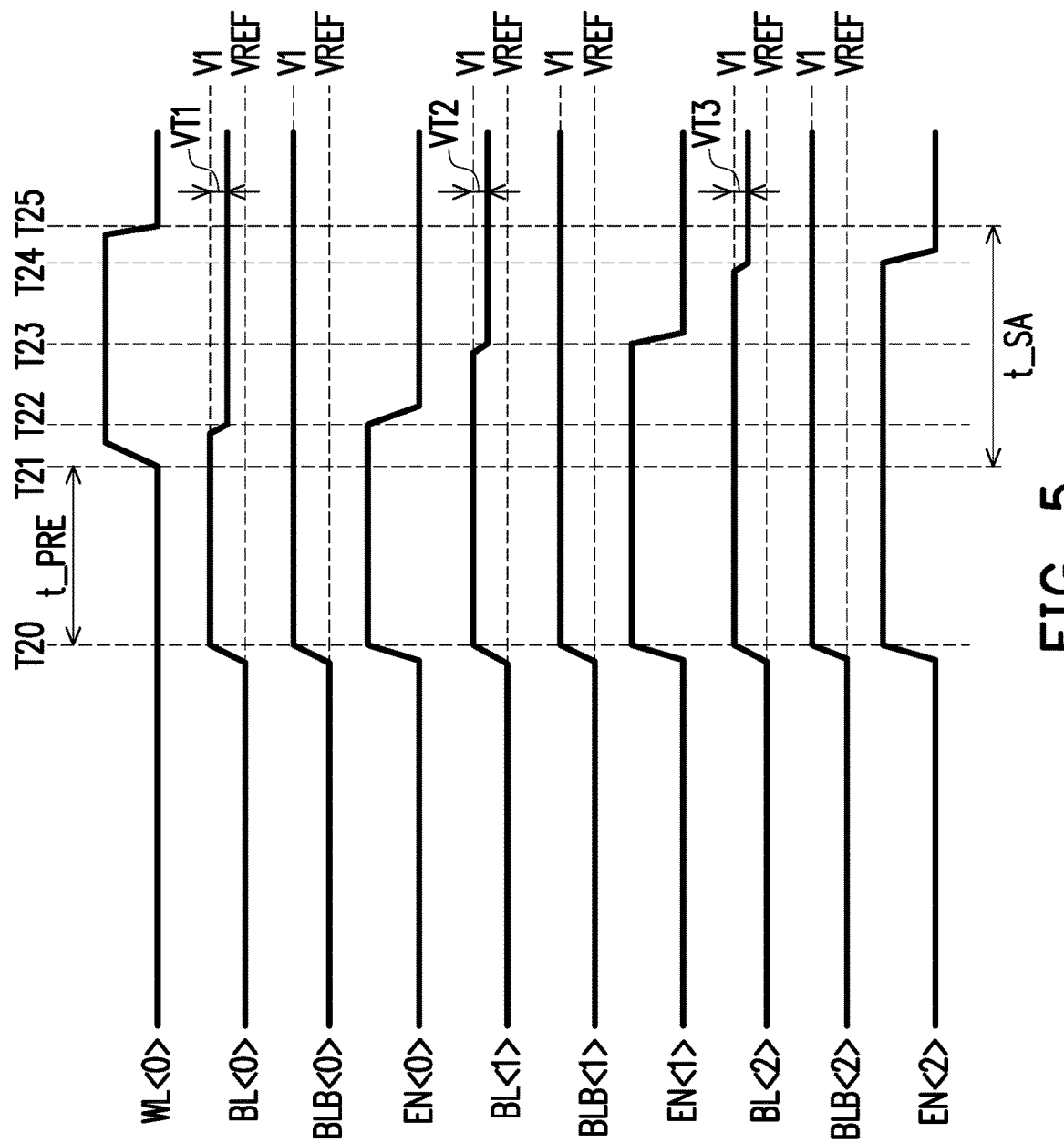
FIG. 5 is a timing diagram of signals for the data read operation performed by three differential type non-volatile memory circuits having different reading speeds according to an embodiment of the invention.

Referring to FIG. 5. FIG. 5 is a timing diagram of the data read operation performed by three differential type non-volatile memory circuits having different reading speeds according to an embodiment of the invention. As shown in FIG. 5, the signal BL<0> and the signal BLB<0> respectively represent the signals of the bit line and the complementary bit line in a first differential type non-volatile memory circuit, and the signal EN<0> represents the states of the first source line switch, the second-source line switch, and the first switching circuit and the second switching circuit of the differential sensing circuit in the first differential type non-volatile memory circuit. The signal EN<0> at the logic high level indicates the on state, and the signal EN<0> at the logic low level indicates the off state. The signal BL<1> and the signal BLB<1> respectively represent the signals of the bit line and the complementary bit line in a second differential type non-volatile memory circuit, and the signal EN<1> represents the states of the first source line switch, the second-source line switch, and the first switching circuit and the second switching circuit of the differential sensing circuit in the second differential type non-volatile memory circuit. The signal EN<1> at the logic high level indicates the on state, and the signal EN<1> at the logic low level indicates the off state. The signal BL<2> and the signal BLB<2> respectively represent the signals of the bit line and the complementary bit line in a third differential type non-volatile memory circuit, and the signal EN<2> represents the states of the first source line switch, the second source line switch, and the first switching circuit and the second switching circuit of the differential sensing circuit in the third differential type non-volatile memory circuit. The signal EN<2> at the logic high level indicates the on state, and the signal EN<0> at the logic low level indicates the off state.

In the pre-charging phase t_PRE from the time point T20 to the time point T21, the bit lines, the data lines, the complementary bit lines, and the complementary data lines of the three differential type non-volatile memory circuits are all charged to the first voltage V1. Then, in the read operation phase t_SA from the time point T21 to the time point T25, the word line WL<0> is enabled. Therefore, in each of the three differential type non-volatile memory circuits, a differential non-volatile memory cell corresponding to the enabled word line WL<0> is selected. The cell current of the selected differential non-volatile memory cell in each of the differential type non-volatile memory circuits cause the corresponding bit line and the corresponding data line starts discharging at the time point T21, and the voltage on the complementary bit line and the complementary data line are maintained at the first voltage V1.

It should be noted that, since the cell currents of the selected differential non-volatile memory cells in the three differential type non-volatile memory circuits would be different, the data reading speeds of the three differential type non-volatile memory circuits would not be the same. As shown in FIG. 5, the cell current of the selected differential non-volatile memory cell in the first differential type non-volatile memory circuit is larger, i.e. the first differential type non-volatile memory circuit is with faster reading speed. Therefore, at the time point T22, the voltage difference between the bit line signal BL<0> and the complementary bit line signal BLB<0> of the first differential type non-volatile memory circuit is equal to the sensing threshold voltage VT1 of the sense amplifier in the differential sensing circuit in the first differential type non-volatile memory circuit, such that the logic state of the first output terminal and the logic state of the second output terminal of the differential sensing circuit in the first differential type non-volatile memory circuit starts to be different, thereby the first switching circuit, the second switching circuit, the first source line switch and the second source line switch in the first differential type non-volatile memory circuit are turned off, so as to prevent the electric charge on the data line DL (the bit line BL) and the complementary data line DLB (the complementary bit line BLB) in the first differential type non-volatile memory circuit from being dumped.

The cell current of the selected differential non-volatile memory cell in the second differential type non-volatile memory circuit is medium, i.e. the second differential type non-volatile memory circuit is with medium reading speed. Therefore, at a time point T23 after the time point T22, the voltage difference between the bit line signal BL<1> and the complementary bit line signal BLB<1> of the second differential type non-volatile memory circuit is equal to the sensing threshold voltage VT2 of the sense amplifier in the differential sensing circuit in the second differential type non-volatile memory circuit, such that the logic state of the first output terminal and the logic state of the second output terminal of the differential sensing circuit in the second differential type non-volatile memory circuit starts to be different, thereby the first switching circuit, the second switching circuit, the first source line switch and the second source line switch in the second differential type non-volatile memory circuit are turned off, so as to prevent the electric charge on the data line DL (the bit line BL) and the complementary data line DLB (the complementary bit line BLB) in the second differential type non-volatile memory circuit from being dumped.

The cell current of the selected differential non-volatile memory cell in the third differential type non-volatile memory circuit is smaller, i.e. the third differential type non-volatile memory circuit is with slower reading speed. Therefore, at the time point T24 after the time point T23, the voltage difference between the bit line signal BL<2> and the complementary bit line signal BLB<2> of the third differential type non-volatile memory circuit is equal to the sensing threshold voltage VT3 of the sense amplifier in the differential sensing circuit in the third differential type non-volatile memory circuit, such that the logic state of the first output terminal and the logic state of the second output terminal of the differential sensing circuit in the third differential type non-volatile memory circuit starts to be different, thereby the first switching circuit, the second switching circuit, the first source line switch and the second source line switch in the third differential type non-volatile memory circuit are turned off, so as to prevent the electric charge on the data line DL (the bit line BL) and the complementary data line DLB (the complementary bit line BLB) in the third differential type non-volatile memory circuit from being dumped.

Incidentally, the sensing threshold voltage VT1, VT2, and VT3 may be different, thereby the time points at which the first switching circuit, the second switching circuit, the first source line switch and the second source line switch in the tree differential type non-volatile memory circuits are turned off may also be affected.

It could be understood that, the time point at which the first switching circuit, the second switching circuit, the first source line switch, and the second source line switch of each differential type non-volatile memory circuit are turned off is related to the data reading speed of each differential type non-volatile memory circuit. Therefore, the time point at which the first switching circuit, the second switching circuit, the first source line switch, and the second source line switch of each differential type non-volatile memory circuit are turned off could be individually controlled to optimize the power saving.

In view of the foregoing, in the embodiments of the invention, when the logic states of the differential output terminal pair of the differential sensing circuit starts to be different, the differential type non-volatile memory circuit may disconnect the differential sensing circuit from the differential data line pair and turn off the first source line switch and the second source line switch. In this way, electric charge on the differential data line pair and the differential bit line pair could be prevented from being dumped, so as to achieve power saving. In addition, since the differential sensing circuit and the differential data line pair are disconnected, the input loading of the differential sensing circuit could be reduced, thereby the operation current of the differential sensing circuit may be reduced, so as to achieve power saving.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A differential type non-volatile memory circuit, comprising:
   a differential sensing circuit, having a differential input terminal pair and a differential output terminal pair;
   a differential data line pair, electrically connected to the differential input terminal pair of the differential sensing circuit;
   a memory cell array, having at least one differential non-volatile memory cell configured to store data;
   a differential bit line pair, electrically connected between the memory cell array and the differential data line pair;
   a first source line switch, connected between a bit line of the differential bit line pair and a reference voltage, a first end of the first source line switch is electrically connected to the reference voltage; and
   a second source line switch, connected between another bit line of the differential bit line pair and the reference voltage, a first end of the second source line switch is electrically connected to the reference voltage, wherein
   the differential bit line pair is pre-charged to a first voltage in a first pre-charging phase,
   when logic states of the differential output terminal pair start to be different in a read operation phase of the memory cell array after the first pre-charging phase of the memory cell array, the differential data line pair is disconnected from the differential sensing circuit, the first source line switch and the second source line switch are turned off,
   when the first source line switch and the second source line switch are turned off, a voltage on the bit line of the differential bit line pair is equal to a second voltage, the second voltage is equal to the first voltage minus a sensing threshold voltage of the differential sensing circuit,
   the voltage on the bit line of the differential bit line pair is between the second voltage and the reference voltage in an idle phase of the memory cell array after the read operation phase of the memory cell array, and
   the voltage on the bit line of the differential bit line pair are pre-charged to the first voltage in a second pre-charging phase after the idle phase of the memory cell array.

2. The differential type non-volatile memory circuit as claimed in claim 1, further comprising:
   a differential source line pair, including a first source line and a second source line, wherein the first source line is electrically connected between the memory cell array and a second end of the first source line switch, and the second source line is electrically connected between the memory cell array and a second end of the second source line switch.

3. The differential type non-volatile memory circuit as claimed in claim 2, wherein the differential data line pair, the differential bit line pair, and the differential source line pair are floating after the differential sensing circuit and the differential data line pair are disconnected and the first source line switch and the second source line switch are turned off.

4. The differential type non-volatile memory circuit as claimed in claim 2, wherein the differential sensing circuit and the differential data line pair are electrically connected and the first source line switch and the second source line switch are in an on state in the first pre-charging phase.

5. The differential type non-volatile memory circuit as claimed in claim 4, wherein the differential data line pair is pre-charged in the first pre-charging phase to the first voltage, and the logic states of the differential output terminal pair are identical.

6. The differential type non-volatile memory circuit as claimed in claim 5, wherein when the logic states of the differential output terminal pair are identical in the read operation phase of the memory cell array, the differential sensing circuit and the differential data line pair are electrically connected, and the first source line switch and the second source line switch are in the on state.

7. The differential type non-volatile memory circuit as claimed in claim 5, wherein when the logic states of the differential output terminal pair are identical in the read operation phase of the memory cell array, a data line of the differential data line pair and the bit line of the differential bit line pair are discharged.

8. The differential type non-volatile memory circuit as claimed in claim 7, wherein when a voltage difference between the differential data line pair is greater than or equal to the sensing threshold voltage of the differential sensing circuit in the read operation phase of the memory cell array, the differential output terminal pair output different logic states.

9. The differential type non-volatile memory circuit as claimed in claim 5, wherein when the differential sensing circuit and the differential data line pair are disconnected in the read operation phase of the memory cell array, a voltage on a data line of the differential data line pair is equal to the second voltage.

10. The differential type non-volatile memory circuit as claimed in claim 9, wherein the voltage on the data line of the differential data line pair is between the second voltage and the reference voltage in the idle phase of the memory cell array after the read operation phase of the memory cell array.

11. The differential type non-volatile memory circuit as claimed in claim 2, wherein in the idle phase of the memory cell array after the read operation phase of the memory cell array, the differential sensing circuit is disconnected from the differential data line pair, the logic states of the differential output terminal pair are different, the first source line switch and the second source line switch are in an off state, and the differential data line pair, the differential bit line pair and the differential source line pair are floating.

12. The differential type non-volatile memory circuit as claimed in claim 2, wherein the differential sensing circuit is disconnected from the differential data line pair and logic states of the differential output terminal pair are identical in a standby phase of the memory cell array.

13. The differential type non-volatile memory circuit as claimed in claim 2, wherein the first source line switch and the second source line switch are in an on state and a voltage on the differential data line pair and a voltage on the differential bit line pair are at the reference voltage in a standby phase of the memory cell array.

14. The differential type non-volatile memory circuit as claimed in claim 1, wherein the differential input terminal pair includes a first input terminal and a second input terminal, and the differential output terminal pair includes a first output terminal and a second output terminal, wherein the differential sensing circuit comprises:
a first switching circuit, wherein a first end of the first switching circuit is coupled to the first input terminal;
a second switching circuit, wherein a first end of the second switching circuit is coupled to the second input terminal;
a sense amplifier, coupled to a second end of the first switching circuit and a second end of the second switching circuit, and configured to amplify a voltage difference of the differential data line pair to generate a first differential signal pair when the first switching circuit and the second switching circuit are turned on; and
a latch circuit, coupled to the sense amplifier to receive and latch the first differential signal pair and provide a first output voltage and a second output voltage to the first output terminal and the second output terminal respectively.

* * * * *